(12) United States Patent
Vanderberg et al.

(10) Patent No.: US 9,318,302 B1
(45) Date of Patent: Apr. 19, 2016

(54) INTEGRATED EXTRACTION ELECTRODE MANIPULATOR FOR ION SOURCE

(71) Applicant: Axcelis Technologies, Inc., Beverly, MA (US)

(72) Inventors: Bo Vanderberg, Gloucester, MA (US); Joseph Valinski, Newmarket, NH (US); Michael Cristoforo, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 14/674,694

(22) Filed: Mar. 31, 2015

(51) Int. Cl.
| H01J 27/02 | (2006.01) |
| H01J 37/08 | (2006.01) |
| H01J 37/30 | (2006.01) |
| H01J 37/317 | (2006.01) |

(52) U.S. Cl.
CPC ......... *H01J 37/3007* (2013.01); *H01J 37/3171* (2013.01)

(58) Field of Classification Search
CPC ....... H01J 37/08; H01J 37/3171; H01J 37/05; H01J 37/09; H01J 37/15; H01J 27/022; H01J 27/024; H01J 27/08
USPC ........... 250/423 R, 492.21, 305, 396 R, 492.1
See application file for complete search history.

(56) References Cited

U.S. PATENT DOCUMENTS

| 5,420,415 | A | | 5/1995 | Trueira | |
| 5,661,308 | A | | 8/1997 | Benveniste et al. | |
| 5,920,076 | A | * | 7/1999 | Burgin | H01J 27/022 250/423 R |
| 6,559,454 | B1 | * | 5/2003 | Murrell | H01J 27/022 250/423 R |
| 7,022,984 | B1 | * | 4/2006 | Rathmell | H01J 37/05 250/305 |
| 7,655,924 | B2 | * | 2/2010 | Goldberg | H01J 27/024 250/423 R |
| 7,842,931 | B2 | | 11/2010 | Satoh et al. | |
| 7,915,597 | B2 | * | 3/2011 | Huang | H01J 37/20 250/396 R |
| 2005/0242293 | A1 | | 11/2005 | Benveniste | |
| 2009/0236547 | A1 | * | 9/2009 | Huang | H01J 37/20 250/492.21 |
| 2014/0326901 | A1 | * | 11/2014 | Colvin | H01J 37/3171 250/492.21 |
| 2015/0270100 | A1 | * | 9/2015 | Jerez | H01J 37/08 250/396 R |

* cited by examiner

*Primary Examiner* — David A Vanore
(74) *Attorney, Agent, or Firm* — Eschweiler & Associates, LLC

(57) ABSTRACT

A modular ion source and extraction apparatus comprises an ion source chamber selectively electrically coupled to a voltage potential, wherein the ion source chamber comprises an extraction aperture. An extraction electrode is positioned proximate to the extraction aperture of the ion source chamber, wherein the extraction electrode is electrically grounded and configured to extract ions from the ion source chamber. One or more linkages operably couple to the ion source chamber, and one or more insulators couple the extraction electrode to the respective one or more linkages, wherein the one or more insulators electrically insulate the respective one or more linkages from the extraction electrode, therein electrically insulating the extraction electrode from the ion source chamber. One or more actuators operably couple the one or more linkages to the ion source chamber, wherein the one or more actuators are configured to translate the one or more linkages with respect to the ion source chamber, therein translating the extraction electrode in one or more axes.

20 Claims, 4 Drawing Sheets

INTEGRATED EXTRACTION ELECTRODE MANIPULATOR FOR ION SOURCE

FIELD OF THE INVENTION

The present invention relates generally to ion implantation systems and more specifically to an ion source having a modular ion source having an integrated extraction electrode manipulator that reduces the amount of time and maintenance associated with the ion source and extraction electrode.

BACKGROUND OF THE INVENTION

In the manufacture of semiconductor devices and other ion related products, ion implantation systems are used to impart dopant elements into semiconductor wafers, display panels, or other types of workpieces. Typical ion implantation systems or ion implanters impact a workpiece with an ion beam utilizing a known recipe or process in order to produce n-type or p-type doped regions, or to form passivation layers in the workpiece. When used for doping semiconductors, the ion implantation system injects selected ion species to produce the desired extrinsic material. Typically, dopant atoms or molecules are ionized and isolated, sometimes accelerated or decelerated, formed into a beam, and implanted into a workpiece. The dopant ions physically bombard and enter the surface of the workpiece, and subsequently come to rest below the workpiece surface in the crystalline lattice structure thereof.

Ion implantation has become the technology preferred by industry to dope semiconductors with impurities in the large-scale manufacture of integrated circuits. Ion dose and ion energy are the two most important variables used to define an implant step. Ion dose relates to the concentration of implanted ions for a given semiconductor material. Typically, high current implanters (generally greater than 10 milliamperes (mA) ion beam current) are used for high dose implants, while medium current implanters (generally capable of up to about 10 mA beam current) are used for lower dose applications.

Ion energy is the dominant parameter used to control junction depth in semiconductor devices. The energy levels of the ions that make up the ion beam determine the degree of depth of the implanted ions. High energy processes such as those used to form retrograde wells in semiconductor devices require implants of up to a few million electron-volts (MeV), while shallow junctions may demand ultra low energy (ULE) levels below one thousand electron-volts (1 keV).

A typical ion implanter comprises three sections or subsystems: (i) an ion source for generating an ion beam, (ii) an ion beam extraction system, (iii) a beamline including a mass analysis magnet for mass resolving the ion beam, and (iv) a target chamber which contains the semiconductor wafer or other substrate to be implanted by the ion beam. The continuing trend toward smaller and smaller semiconductor devices is driving beamline constructions to deliver high beam currents at low energies. High beam currents provide the desired dosage levels, while low energies permit shallow implants. Source/drain extensions in CMOS devices, for example, make it desirable for such a high current, low energy application.

Ion sources in ion implanters typically generate an ion beam by ionizing a source gas containing a desired dopant element within an ion source chamber, and an extraction system extracts the ionized source gas in the form of an ion beam. The ionization process is effected by an electron beam, which may take the form of a thermionic emitter such as a thermally heated filament, or a radio frequency (RF) antenna. A thermionic emitter is typically electrically biased so that emitted electrons gain sufficient energy to ionize, while an RF antenna delivers a high energy RF signal into the source chamber to energize ambient electrons.

The high-energy electrons thus ionize the source gas in the ion source chamber to generate desired ions. Examples of desired dopant ions produced from the source gas may include boron (B), phosphorous (P) or arsenic (As). In an ion source utilizing a thermionic emitter for ionization, the local emitter temperature typically exceeds 2500° C., and the source chamber being thermally irradiated by the emitter may attain temperatures on the order of 700° C.

Ions generated within the ion source are extracted through an elongated source aperture or slit by an electric field associated with one or more extraction electrodes located outside of the source chamber. The source aperture and the extraction electrodes may be made of graphite, taking advantage of the low vapor pressure of graphite at high temperatures and the reduced contamination risk to the workpiece, since very small levels of carbon in silicon have small effects on the semiconductor's electrical properties. Each extraction electrode system typically comprises spaced-apart elements forming an elongated extraction gap through which the ion beam travels. If a positively charged ion beam is desired, the extraction electrode is electrically biased negatively with respect to the source aperture.

Typically, for positive ion extraction more than one extraction electrode are used, with one electrode acting as electron suppression electrode by providing a barrier for electrons present in the system downstream of the extraction system. The suppression electrode is therefore biased negatively with respect to the beamline potential, and the last electrode in the extraction system is typically at beamline potential, to prevent the electric fields from the extraction system from affecting beam transport after extraction. A typical extraction system thus comprises two electrodes; if more electrodes are used, the magnitude of the voltages on the plurality of electrodes is typically decreased on each successive electrode moving downstream so as to provide an accelerating field for the positive ion beam, until the suppression bias is reached.

In designing such an ion implanter, it is desirable for the ion beam generated by and extracted from the ion source to accurately follow a desired predetermined travel path. The precise position of the extraction electrode with respect to the source aperture is important in achieving a beam path that coincides with the predetermined beam path. Thus, precise alignment and positioning of the extraction electrode or electrodes with the source aperture is typically desired.

Extraction electrodes are commonly mounted on a structure that extends from and/or is connected to the source housing. Heat generated by the operation of the ion source during ion implantation processes often causes thermal expansion of this structure, thus resulting in misalignment of the extraction electrodes with the source aperture when the temperature of the electrode system varies while the system reaches a new equilibrium. Further, alignment of the electrodes with respect to the ion source conventionally necessitates removal of the ion source and/or extraction electrodes from the ion implantation system, whereby various deleterious alignment issues can arise. Alternatively, the extraction electrodes are separate from the ion source, whereby removal of either the ion source or the extraction electrodes for maintenance can lead to additional misalignment. Such misalignments may cause unwanted disruptions in the intended path of the ion beam and result in unwanted "beam steering", as well as distortions in the ion beam quality which could impair its transport through the rest of the beamline.

Various mechanisms for adjusting the position of the extraction electrodes with respect to the source aperture in ion implanters are known. Such mechanisms can be seen in U.S. Pat. No. 5,420,415 to Trueira, U.S. Pat. No. 5,661,308 to Benveniste et al., and U.S. Patent Publication No. 2005/0242293 to Benveniste. Conventionally, manipulation of the extraction electrodes is performed by extraction electrode manipulators that are separate from the ion generation mechanism or ion source. As such, multiple components are removed from the ion implantation system, thus leading to additional misalignment.

Additionally, the extraction electrodes are conventionally electrically isolated from the ion source in order to provide proper extraction potentials between the extraction electrode and ion source. Separation of the extraction electrode and ion source has been achieved by using vacuum as an electrical insulator, as doing so makes the individual components easier to handle and maintain. However, using vacuum as the electrical insulator comes at a disadvantage of mechanical decoupling, thus leading to alignment issues as described above. Conventionally, in order to service either the ion source or the extraction electrodes, an operator would remove the two assemblies separately, and then realign them with fixtures. Thus, conventional ion source and extraction electrode maintenance has been time-consuming and often fraught with misalignment issues that lead to additional downtime or waste.

SUMMARY OF THE INVENTION

The present invention overcomes various limitations of the prior art by providing a modular ion source having an integrated extraction electrode manipulator, wherein the modular nature of the ion source provides for an efficient ion implantation system having reduced maintenance costs.

Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to a modular ion source and extraction apparatus that may be easily replaced and maintained in an ion implantation system. According to one exemplary aspect of the invention, the modular ion source and extraction apparatus comprises an ion source chamber, wherein the ion source chamber is selectively electrically coupled to a voltage potential. The ion source chamber further comprises a source or extraction aperture positioned near a distal end thereof.

An extraction electrode system is further positioned proximate to the extraction aperture of the ion source chamber, wherein the first extraction electrode is electrically biased to an appropriate potential and configured to extract ions from the ion source chamber. Subsequent electrodes of the extraction system may be biased to accelerate and focus the extracted beam to a desired energy and shape. The next-to-last electrode, for example, may be biased negative with respect to the beam guide, such that electrons downstream from the extraction system are effectively suppressed by a potential well, and prevented from reaching the ion source chamber. The suppression electrode, for example, may prevent these electrons from forming an energetic electron beam that could load the electric extraction circuit, dissipate additional heat in the source chamber which could cause local melting of material, and generate x-ray radiation which could represent a safety hazard to operators.

The suppression electrode thus permits safe operation of the extraction system while contributing to appropriate focusing and acceleration of the ion beam. The last electrode in the extraction system, for example, is at beam guide potential, effectively terminating extraction fields and permitting ion beam self-neutralization downstream of the extraction system. Self-neutralization is an effect that helps enhance the transport of ions, especially in high current ion beams. In the case of a two-electrode extraction system, for example, the first electrode acts as the extraction and suppression electrode, and the second (or last) electrode is grounded.

According to one aspect, one or more linkages are operably coupled to the ion source chamber. One or more insulators further couple the extraction electrode system to the respective one or more linkages, wherein the one or more insulators electrically insulate the respective one or more linkages from the extraction electrode. Thus, the extraction electrode system is electrically insulated from the ion source chamber via the one or more insulators.

One or more actuators are further provided, wherein the one or more actuators operably couple the one or more linkages to the ion source chamber. The one or more actuators, for example, are configured to translate the one or more linkages with respect to the ion source chamber, therein translating the extraction electrode system along one or more axes. Thus, a modular ion source and extraction electrode assembly is provided, whereby conventional maintenance and alignment issues may be ameliorated due to the modular nature of the present disclosure.

In accordance with one exemplary aspect, the one or more linkages comprise at least one gap controlling linkage and at least one angle controlling linkage. The one or more actuators further comprise a gap controlling actuator and an angle controlling actuator. The gap controlling actuator, for example, is operably coupled to the ion source chamber and configured to linearly translate the at least one gap controlling linkage along a first axis with respect to the ion source chamber. The angle controlling actuator, for example, is operably coupled to the ion source chamber and configured to linearly translate the at least one angle controlling linkage along a second axis with respect to the ion source chamber, wherein the first axis and second axis are approximately parallel and spaced a predetermined distance apart. The second axis, for example, may vary angularly with respect to the first axis, however, as long as variability of such a tilt angle is small, any aforementioned variation is of the order of tilt angle, and thus, also small.

A linear translation stage may be further provided, wherein a base of the linear translation stage is generally fixedly coupled to the ion source chamber and a platform of the linear stage is in linear sliding engagement with the base. The at least one gap controlling linkage, for example, is generally fixedly coupled to the platform. A frame is further operably coupled to the platform, wherein the gap controlling actuator is configured to linearly translate the platform and frame generally parallel to the first axis, therein linearly translating the at least one gap controlling linkage along the first axis.

In another example, the angle controlling actuator is fixedly coupled to the platform, wherein the gap controlling actuator is further configured to linearly translate the angle controlling actuator generally parallel to the first axis. Thus, the at least one angle controlling linkage is further linearly translated along the second axis along with the at least one gap controlling linkage upon actuation of the gap controlling actuator, while the angle controlling actuator is still operably to linearly translate the angle controlling linkage with respect to the platform.

According to yet another example, the ion source chamber comprises a flange that is distally opposed to the extraction aperture. The flange, for example, comprises an interior side facing toward the extraction aperture and an exterior side opposing the interior side. The linear translation stage and frame, for example, are operably coupled to the exterior side of the flange. The base of the linear translation stage may be fixedly coupled to the exterior side of the flange. The flange may further comprise one or more passages extending therethrough from the interior side to the exterior side of the flange, wherein the at least one gap controlling linkage and at least one angle controlling linkage pass through the one or more passages of the flange. In one example, the at least one gap controlling linkage and at least one angle controlling linkage are in sliding engagement with the one or more passages.

A bellows may further respectively couple the flange to each of the at least one gap controlling linkage and at least one angle controlling linkage, wherein each bellows provides a seal (e.g. vacuum seal) between the interior side of the flange and an environment associated with the exterior side of the flange. Alternatively, various other seals configured to provide a vacuum seal, such as an o-ring based sliding seal, could be used.

The frame, for example, may comprise a yoke having distal ends associated therewith, wherein the at least one gap controlling linkage comprises a first gap controlling linkage and a second gap controlling linkage fixedly coupled to respective distal ends of the yoke along the tilt axis. Accordingly, the linear translation stage comprises a plurality of bases fixedly coupled to the ion source chamber and a plurality of platforms in respective linear sliding engagement with the plurality of bases, wherein the plurality of platforms are fixedly coupled to the yoke.

A controller may be further provided and configured to selectively independently actuate the gap controlling actuator and angle controlling actuator, therein independently controlling the translation of the extraction electrode system along the one or more axes.

In another example, the gap controlling actuator and angle controlling actuator are operably coupled to a sidewall of the ion source chamber.

According to another exemplary aspect of the invention, an ion implantation system comprises an ion beam source including the above modular ion source and extraction electrode manipulator apparatus. A beam line assembly receives the ion beam from the source comprising a mass analyzer that selectively passes selected ions and an end station that receives the ion beam from the beam line assembly.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
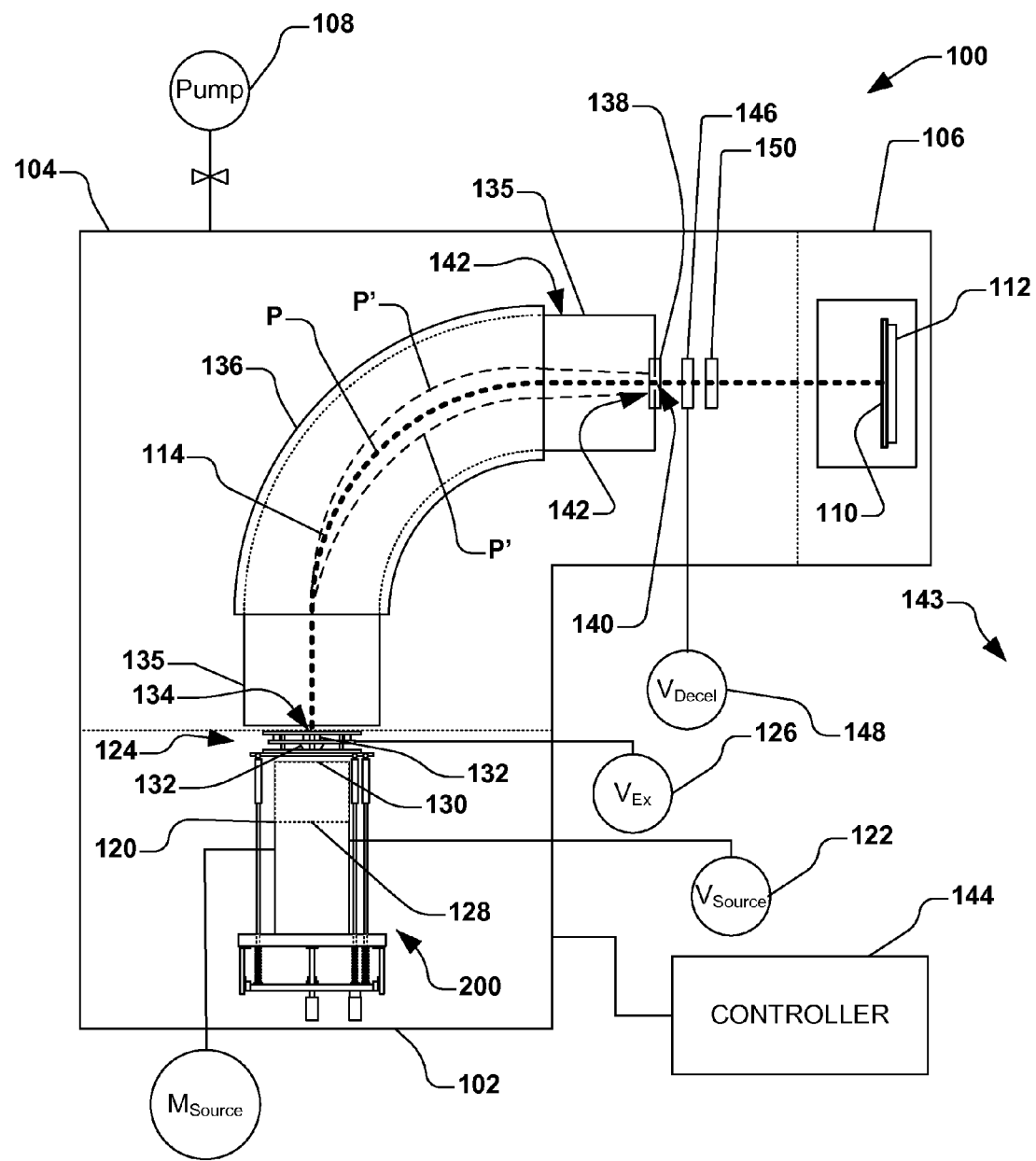
FIG. 1 illustrates an exemplary ion implantation system according to one example of the present disclosure.

The present invention is directed generally towards a modular ion source and extraction electrode manipulator system and method of use, thereof. More particularly, the system and method efficiently extract an ion beam utilized in an ion implantation system with lower maintenance costs by providing the modular ion source and extraction electrode manipulator assembly.

Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the Figures, in order to gain a better understanding of the disclosure, exemplary ion implantation system 100 is schematically illustrated in FIG. 1, wherein the exemplary ion implantation system is suitable for implementing one or more aspects of the present invention. It should be noted that although the ion implantation system 100 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 100 of FIG. 1, for example, comprises a terminal 102, a beamline assembly 104, and an end station 106 (e.g., comprising a process chamber), wherein the ion implantation system is generally placed under vacuum by one or more vacuum pumps 108. The ion implantation system 100, for example, is configured to implant ions into a workpiece 110 (e.g., a semiconductor wafer, display panel, etc.). In one example, the ion implantation system 100 is configured to implant ions into a single workpiece 110 (e.g., a "serial" ion implanter), wherein the workpiece generally resides on a support 112 (e.g., a pedestal or electrostatic chuck) situated within the end station 106. Alternatively, the ion implantation system 100 is configured to implant ions into multiple workpieces 110 (e.g., a "batch" ion implanter), wherein the end station 106 comprises a rotating disk (not shown), whereon several workpieces are translated with respect to an ion beam 114. It should be noted that any ion implantation apparatus operable to extract ions from an ion source and implant them into one or more workpieces is contemplated as falling within the scope of the present invention.

The terminal 102, for example, comprises an ion source 120 powered by a source power supply 122 ($V_{source}$) that defines the energy of extracted ions, and an extraction assembly 124 powered by an extraction power supply 126 ($V_{Ex}$) to extract ions from the ion source via an extraction voltage $V_{Extract}$. The extraction assembly 124, in conjunction with the beamline assembly 104, for example, is operable to direct the ions toward the workpiece 110 residing on the support 112 in the end station 106 for implantation thereof at a given energy level.

In one example, the ion source 120 biased at potential $V_{source}$ comprises a plasma chamber 128 wherein ions of a process material $M_{source}$ are generated at relatively high plasma densities (e.g., $10^{10}$ to $10^{13}$ cm$^{-3}$). It should be noted that generally, positive ions are generated, although the present invention is also applicable to systems wherein negative ions are generated by the ion source 120. The extraction assembly 124 further comprises an extraction aperture 130 and one or more extraction electrodes 132, wherein the extraction aperture is biased to the extraction potential $V_{source}$. The extraction voltage $V_{Extract}$ is defined by the potential $V_{source}$ and the voltage $V_{Ex}$ applied to extraction electrodes, thereby providing the extracted ion beam 114 to the beamline assembly 104. In one example, if an ion energy of 120 keV is desired, $V_{source}$=120 kV with respect to the workpiece 110, when the workpiece is grounded. The extraction assembly 124 and configuration thereof is discussed in further detail infra.

In accordance with the disclosure, when the first of the one or more extraction electrodes 132 is at suppression potential, for example, the extraction voltage $V_{Extract}$ may be defined as the difference of the potentials of the extraction power supply 126 ($V_{Ex}$) and source power supply 122 ($V_{source}$). In another example, when the first electrode is grounded, the extraction voltage $V_{Extract}$ may be defined as the potential of the source power supply 122. It will be understood that various other configurations of the one or more extraction electrodes 132 and electrical connections thereto are contemplated as falling within the scope of the present disclosure.

If positive ions are generated, the one or more extraction electrodes 132, for example, are biased at a voltage less than $V_{source}$ (e.g., an extraction voltage of 0-100 kV). The negative relative potential at the one or more extraction electrodes 132 with respect to the extraction electrode creates an electrostatic field between the extraction aperture 130 and one or more extraction electrodes 132 operable to extract and accelerate the positive ions out of the ion source 120. For example, the one or more extraction electrodes 132 have one or more electrode apertures 134 associated therewith, wherein positively charged ions exit the ion source 120 through the extraction aperture 130 and one more electrode apertures to form the ion beam 114, and wherein a velocity of the extracted ions is generally determined by the potential $V_{Extract}$ provided to the one or more extraction electrodes, and the final velocity after extraction is determined by $V_{source}$.

The beamline assembly 104, for example, comprises a beamguide 135 having an entrance near the ion source 120 (e.g., associated with the extraction aperture 130), a mass analyzer 136 that receives the extracted ion beam 114, and an exit with a resolving plate 138, wherein the mass analyzer generally creates a dipole magnetic field to significantly pass only ions of appropriate charge-to-mass ratio or range thereof (e.g., a mass analyzed ion beam having ions of a desired mass range) to the workpiece 110 positioned in the end station 106. In general, the ionization of source materials in the ion source 120 generates a species of positively charged ions having a desired atomic mass. However, in addition to the desired species of ions, the ionization process will also generate a proportion of ions having other masses as well. Ions having an atomic or molecular mass above or below the proper mass are not suitable for implantation and are referred to as undesirable species. The magnetic field generated by the mass analyzer 136 generally causes the ions in the ion beam 114 to move in an arcuate trajectory, and accordingly, the magnetic field is established such that only ions having an mass equal to the mass of the desired ion species traverse the beam path P to the end station 106.

The resolving plate 138 at the exit of the beamguide 135, for example, operates in conjunction with the mass analyzer 136 in order to eliminate undesirable ion species from the ion beam 114 that have a different charge-to-mass ratio from the charge-to-mass of the desired species of ions. The resolving plate 138, for example, includes one or more elongated apertures 140, wherein the ions in the ion beam 114 pass through the aperture as they exit the beamguide 135. At the resolving plate 138, a dispersion of desired ions from the path P of the ion beam 110 (e.g., illustrated at P') is at its minimum value, wherein a width of the ion beam (P'-P') is at a minimum where the ion beam 114 passes through the resolving aperture 140. Undesirable species of ions having a mass much larger or much smaller than the desired ion mass are substantially deflected from the desired beam path P within the beamguide 135 of FIG. 1, and generally do not exit the beamguide. However, if the mass of an undesirable ion closely approximates the mass of the desired species, the trajectory of the undesirable ion will be only slightly deflected from the desired beam path P. Accordingly, such an undesirable ion having only a slight deflection from the desired beam path P would have a tendency to impact an upstream facing surface 142 of the resolving aperture 140.

In one example, the strength and orientation of the magnetic field of the mass analyzer 136, as well as the velocity of the ions extracted from the ion source 120, is established by a controller 144, such that generally, only ions having a mass equal to the mass of the desired species will traverse the predetermined, desired ion beam path P to the end station 106. The controller 144, in one example, is operable to control all aspects the ion implantation system 100. The controller 144, for example, is operable to control the source power supply 122 for producing the ions, as well as the extraction power supply 126, wherein the ion beam path P is generally controlled. The controller 144, for example, is further operable to adjust the strength and orientation of the magnetic field associated with the mass analyzer 136, among other things. In another example, the controller 144 is further operable to control a position of the workpiece 110 within the end station 106, and can be further configured to control a transfer of the workpiece between the end station 106 and an external environment 143. It will be appreciated that the controller 144 may comprise a processor, computer system, and/or operator for overall control of the system 100 (e.g., a computer system in conjunction with input by an operator).

In an ion implantation system 100 running at a high-current, for example, a length of the beam path P is relatively short, and a deceleration of the ion beam 114 (e.g., called "decel mode"), is often desired just prior to the ion beam impacting the workpiece 110. In such a system, a decel suppression plate 146 is provided downstream of the resolving plate 138, wherein a decel suppression voltage $V_{Decel}$ provided by a decel suppression voltage supply 148 generally decelerates the ion beam and prevents electrons from traveling upstream along the beamline P. A ground plate 150 is further provided downstream of the decel suppression plate 146 in order to neutralize downstream effects of the decel suppression plate 146. The decel suppression plate 146 and ground plate 150, for example, are further utilized as optics in order to focus the decelerated ion beam 114 prior to impacting the workpiece 110. It should be noted that while the decel suppression plate 146 is utilized in one example to provide deceleration and/or suppression of the ion beam, the decel suppression plate can be comprised of any electrically biased plate and/or aperture, and all such plates and/or apertures are contemplated as falling within the scope of the present invention. Further, while deceleration if the ion beam 114 is discussed as one example, it will be understood that the present disclosure may be practiced without deceleration, wherein a variety of configurations of the ion implantation system, and operation thereof, are contemplated.

Maintenance of the ion implantation system 100 often requires disassembly of various components of the system, wherein repeatable, precise alignment of the components during re-assembly is important to having reproducible implants. As alluded to above, one area that has been conventionally troublesome is the alignment of the extraction electrodes with the ion source. Thus, in accordance with one exemplary aspect, a modular ion source and extraction apparatus 200 is provided with the present disclosure, wherein the modular ion source and extraction apparatus provides reproducible alignment during maintenance and removal of the apparatus from the ion implantation system 100.

Figure 2:
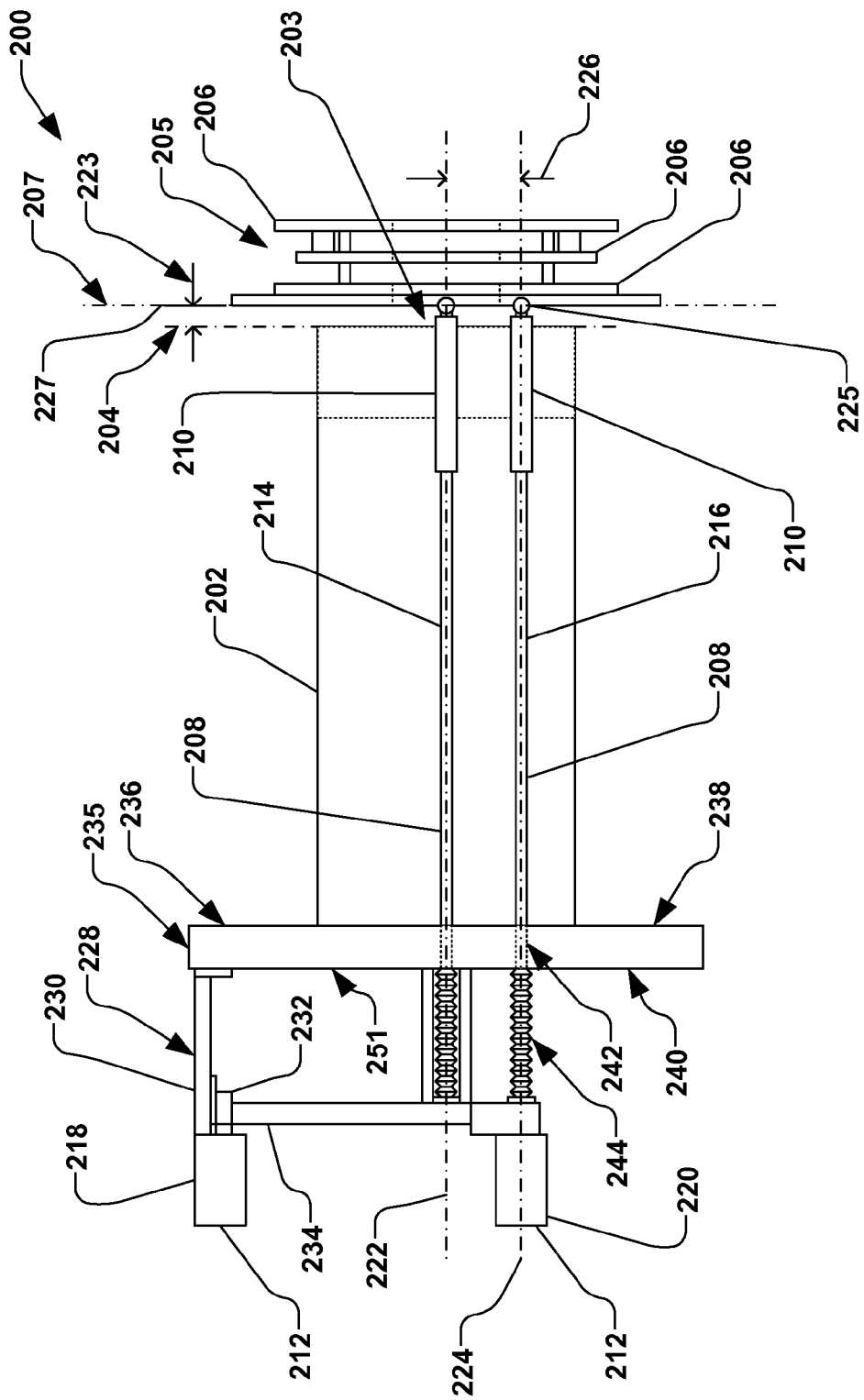
FIG. 2 illustrates a partial cross-sectional view of a modular ion source and extraction electrode apparatus according to one aspect of the disclosure.

Thus, in accordance with the present disclosure, FIG. 2 illustrates the exemplary modular ion source and extraction apparatus 200 in greater detail. The modular ion source and extraction apparatus 200 of FIG. 2, for example, comprises an ion source chamber 202 that is selectively electrically coupled to a voltage potential ($V_{source}$ associated with the source power supply 122 of FIG. 1), wherein the ion source chamber comprises an extraction aperture 203 having an extraction aperture plane 204 associated therewith. An extraction electrode system 205 comprising one or more extraction electrodes 206 associated with an extraction electrode plane 207 is further positioned proximate to the extraction aperture 203 of the ion source chamber 202, wherein the one or more extraction electrodes are respectively electrically grounded or energized and configured to extract ions from the ion source chamber, as discussed previously.

In accordance with one example, one or more linkages 208 (e.g., one or more shafts or other members) are further operably coupled to the ion source chamber 202, wherein one or more insulators 210 further couple the extraction electrode system 205 to the respective one or more linkages. Accordingly, the one or more insulators 210 electrically insulate the respective one or more linkages 208 from the extraction electrode system 205, therein electrically insulating the one or more extraction electrodes 206 from the ion source chamber 202.

One or more actuators 212 are further operably coupled to the one or more linkages 208 and the ion source chamber 202, wherein the one or more actuators are configured to translate the one or more linkages with respect to the ion source chamber, therein translating the extraction electrode system 205 with respect to one or more axes. Accordingly, the ion source chamber 202 is integrated with the extraction electrode system 205 in one cohesive unit, wherein the ion source chamber and extraction electrode(s) 206 are coupled together, regardless of the placement of the extraction apparatus 200 in, or removal therefrom, the ion implantation system 100 of FIG. 1.

The modular ion source and extraction apparatus 200 of FIG. 2, for example, mechanically couples the ion source chamber 202 and extraction electrode system 205 via the one or more linkages 208 and one or more insulators 210, and wherein the one or more actuators 212 are electrically coupled to the ion source chamber, yet the extraction electrode system 205 is electrically isolated from the ion source chamber. As such, during operation of the ion implantation system 100 of FIG. 1, the one or more actuators 212 and one or more linkages 208 of FIG. 2, for example, are at the voltage potential $V_{source}$, while the one or more insulators 210 provide the extraction electrode system 205 at ground or a lower potential than the voltage potential of the ion source chamber 202.

In accordance with another example, the one or more linkages 208 comprise at least one gap controlling linkage 214 and at least one angle controlling linkage 216. Further, the one or more actuators 212 comprise a gap controlling actuator 218 and an angle controlling actuator 220, wherein the gap controlling actuator is operably coupled to the ion source chamber and configured to linearly translate the at least one gap controlling linkage 214 along a first axis 222 with respect to the ion source chamber 202. The gap controlling actuator 218 thus selectively controls a gap 223 between the extraction electrode(s) 206 and the extraction aperture 203 of the ion source chamber 202.

The angle controlling actuator 220, for example, is operably coupled to the ion source chamber 202 and configured to linearly translate the at least one angle controlling linkage 216 along a second axis 224 with respect to the ion source chamber. In another example, the one or more insulators 210 associated with at least one gap controlling linkage 214 and at least one angle controlling linkage 216 are operably coupled the extraction electrode system 205 via one or more ball joints 225, wherein the one or more ball joints provide multiple degrees of freedom of movement of the extraction electrode system with respect to the ion source chamber 202. In the present example, the first axis 222 and second axis 224 are generally parallel and spaced a predetermined distance 226 apart. Accordingly, the angle controlling actuator 220 selectively controls an angle 227 between the extraction electrode system 205 and the extraction aperture 203 of the ion source chamber 202 (e.g., between the extraction aperture plane 204 and the extraction electrode plane 207). The first axis 222 and second axis 224, for example, are approximately parallel, but may vary angularly with respect to one another upon the control of the angle 227. However, as long as variability is small, any parallelism error will thus also be small.

Figure 3:
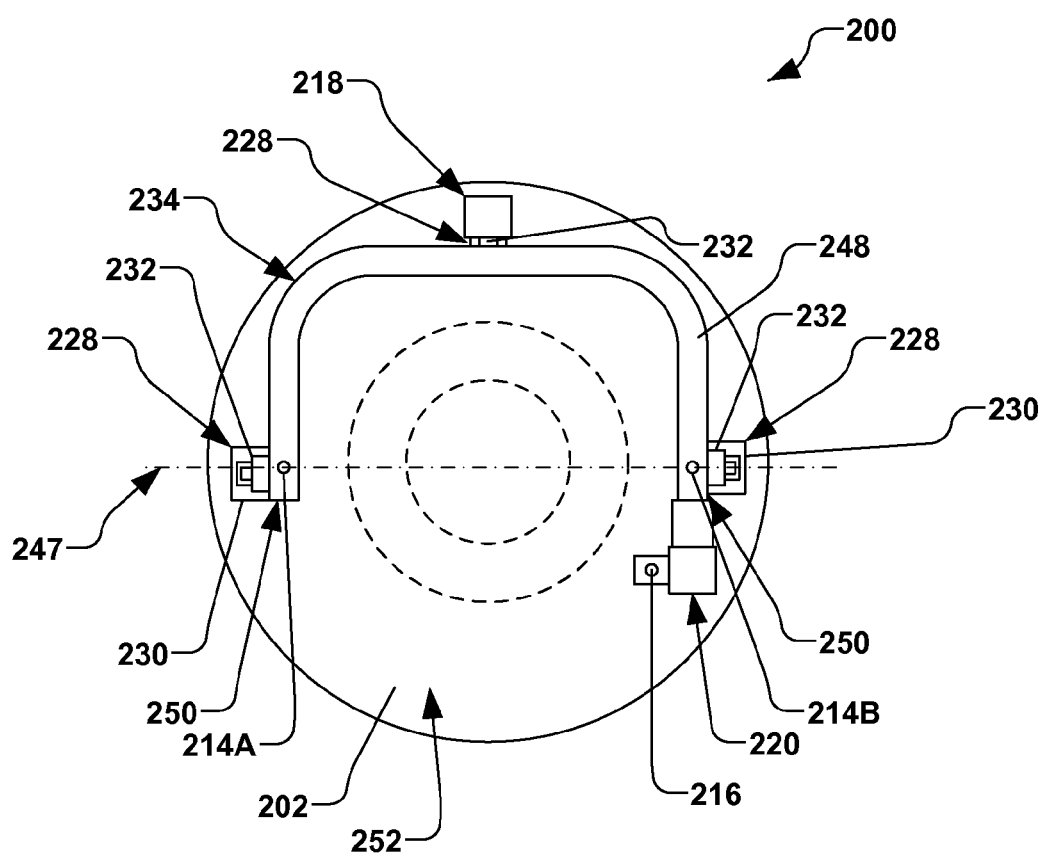
FIG. 3 illustrates an end view of the modular ion source and extraction electrode apparatus of FIG. 2 according to one aspect of the disclosure.

One or more linear translation stages 228 may be further provided, as illustrated in FIG. 3, wherein each linear translation stage, for example, comprises a base 230 that is fixedly coupled to the ion source chamber 202. Each linear translation stage 228 further comprises a platform 232 that is in linear sliding engagement with the respective base 230. In the present example, the at least one gap controlling linkage 214 is generally fixedly coupled to the platform 232. A frame 234, for example, is further operably coupled to the platform 232, wherein the gap controlling actuator 218 is configured to linearly translate both the platform 232 and the frame 234 generally parallel to the first axis 222 of FIG. 2. Thus, via the frame 234, the at least one gap controlling linkage 214 is further linearly translated along the first axis 222 by the gap controlling actuator 218.

In another example, the angle controlling actuator 220 of FIG. 3 is fixedly coupled to the platform 232, wherein the gap controlling actuator 218 is further configured to linearly translate the angle controlling actuator generally parallel to the first axis 222 of FIG. 2, therein further linearly translating the at least one angle controlling linkage 216 along the second axis 224. Thus, the angle 227 between the extraction electrode system 205 and the extraction aperture 203 of the ion source chamber 202 is maintained independent of the gap 223. The angle controlling actuator 220, for example, is further configured to translate the angle controlling linkage 216 with respect to the frame 234, therein controlling the angle 227 independently of the gap 223, as illustrated in the example of FIG. 4C, as will be discussed further infra.

According to another example, a housing 235 of the ion source chamber 202 of FIG. 2 comprises a flange 236 that is distally opposed to the extraction aperture 203. The flange 236, for example, comprises an interior side 238 facing the extraction aperture 203 and an exterior side 240 opposing the interior side. The flange 236, for example, provides a mounting surface (not shown) for mounting the modular ion source and extraction apparatus 200 within the ion implantation system 100 of FIG. 1. In the present example, the one or more linear translation stages 228 (e.g., the base 230 of each linear translation stage) and frame 234 are operably coupled to the exterior side 240 of the flange 236, wherein the flange 236 and components electrically coupled thereto (e.g., the one or more gap controlling actuators 218, one or more angle controlling actuators 220, one or more gap controlling linkages 214, and one or more angle controlling linkages 216) are further at the voltage potential $V_{source}$.

The flange 236, for example, may comprise one or more passages 242 extending through the flange from the interior side 238 to the exterior side 240 thereof, wherein the at least one gap controlling linkage 214 and at least one angle controlling linkage 216 pass through the one or more passages of the flange. In one example, the at least one gap controlling linkage 214 and at least one angle controlling linkage 216 are in sliding engagement with the one or more passages 242. In another example, the at least one gap controlling linkage 214 and at least one angle controlling linkage 216 simply pass through the one or more passages 242 and do not contact the flange 236.

A bellows 244, for example, respectively couples the flange 236 to each of the at least one gap controlling linkage 214 and at least one angle controlling linkage 216, wherein each bellows provides a seal between the interior side 238 of the flange and an environment 246 (e.g., atmosphere or the external environment 143 of FIG. 1 is sealed from the evacuated beamline) associated with the exterior side 240 of the flange of FIG. 2. Alternatively, a sliding seal or other known seal can provide a vacuum seal.

In another example, while not shown, the frame 234 may be rotatably coupled to the platform 232 with respect to a tilt axis 247, wherein the at least one gap controlling linkage 214 is fixedly coupled to the frame along the tilt axis, and wherein the tilt axis is generally perpendicular to the first axis 222. In another example, the frame 234 of FIG. 3 can comprise a yoke 248 having distal ends 250 associated therewith, wherein the at least one gap controlling linkage 214 comprises a first gap controlling linkage 214A and a second gap controlling linkage 214B fixedly coupled to respective distal ends of the yoke along or parallel to the tilt axis 247. Further, the linear translation stage 228 may comprise a plurality of bases 230 fixedly coupled to the ion source chamber 202, wherein a respective plurality of platforms 232 are fixedly coupled to the yoke 248 (e.g., proximate to the respective distal ends 250 of the yoke).

In accordance with yet another aspect, the controller 144 of FIG. 1 is further configured to selectively independently actuate the gap controlling actuator 218 and angle controlling actuator 220, therein independently controlling the translation of the extraction electrode 206 in the one or more axes.

In yet another example, the gap controlling actuator 218 and angle controlling actuator 220 are operably coupled to a sidewall 251 of the housing 235 of the ion source chamber 202 of FIG. 2. While not shown, in another alternative, a single gap controlling actuator 218 and a single angle controlling actuator 220 are fixedly coupled to the sidewall 251 of the housing 235 of the ion source chamber 202 in opposition to each other (e.g., up to 180 degree opposition to one another). Thus, when actuated in unison, the single gap controlling actuator 218 and single angle controlling actuator 220 provide control of the gap 223, and when actuated independently or differentially, provide control of the angle 227 or tilt.

Figure 4A:
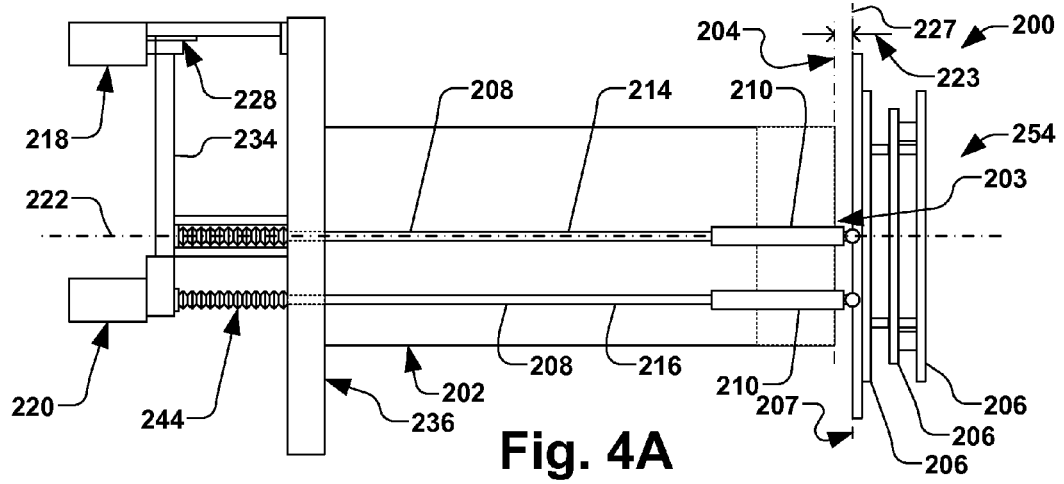
FIGS. 4A-4C illustrate additional partial cross-sectional views of a modular ion source and extraction electrode apparatus in various positions according to other aspects of the disclosure.
Figure 4B:
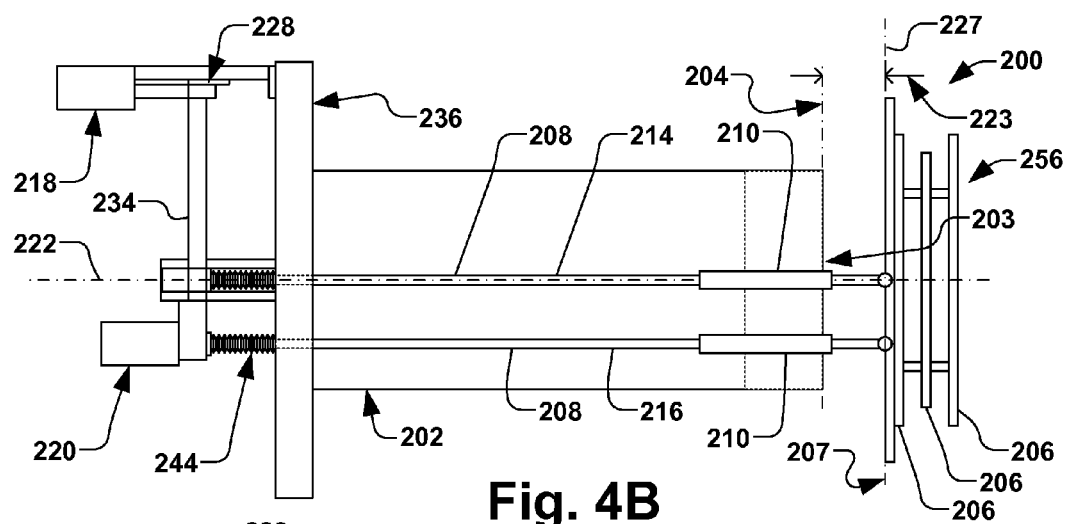
Figure 4C:
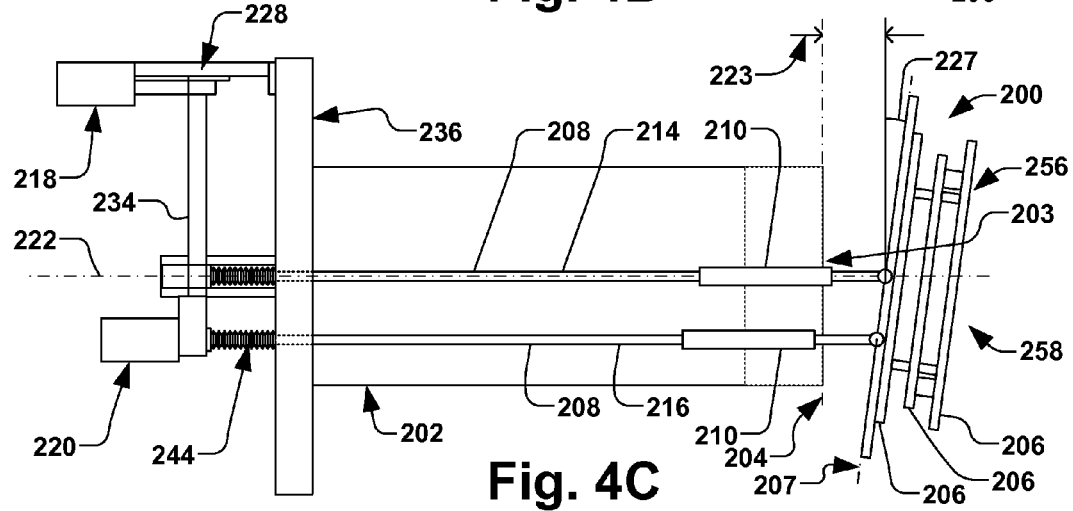

FIGS. 4A-4C illustrate various configurations of the extraction apparatus 200 in accordance with several examples of the present disclosure. FIG. 4A, for example, illustrates the extraction apparatus 200 in a retracted position 254, wherein the extraction electrode system 205 is positioned proximate to the extraction aperture 203 via the gap controlling actuator 218. In the retracted position 254 of FIG. 4A, the at least one gap controlling linkage 214 is retracted such that the gap 223 between the extraction electrode(s) 206 and the extraction aperture 203 of the ion source chamber 202 is at a first predetermined gap value. As illustrated in FIG. 4B, the at least one gap controlling linkage 214 is extended to position the extraction electrode system 205 in an extended position 256 via the gap controlling actuator 218, such that the gap 223 between the extraction electrode(s) 206 and the extraction aperture 203 of the ion source chamber 202 is at a second predetermined gap value. As illustrated in the example of FIGS. 4A and 4B, the angle controlling actuator 220 holds the angle controlling linkage 216 in a substantially constant position with respect to the frame 234, thus maintaining the angle 227 (e.g., shown as being approximately zero degrees in FIGS. 4A and 4B, wherein the extraction aperture plane 204 and the extraction electrode plane 207 are generally parallel) in both the retracted position 252 of FIG. 4A and the extended position 254 of FIG. 4B.

FIG. 4C, for example, also illustrates the extraction apparatus 200 in the extended position 256, wherein the gap 223 between the extraction electrode(s) 206 and the extraction aperture 203 of the ion source chamber 202 is at the first predetermined gap value. However, in FIG. 4C, the extraction apparatus 200 is further illustrated in a tilted position 258, wherein the extraction electrode system 205 is further titled via the angle controlling actuator 220. As illustrated in FIG. 4C, the angle 227 between the extraction aperture 203 of the ion source chamber 202 and the extraction electrode(s) 206 has been modified from that shown in FIG. 4B by the angle controlling actuator 220, wherein the position of the angle controlling linkage 216 with respect to the frame 234 is controlled by the angle controlling actuator, therein presenting the extraction electrode system 205 in the tilted position 258. It should be noted the angle 227 illustrated in FIG. 4C as one example of many possible angles, and that any positive or negative angle is contemplated as falling within the scope of the present disclosure. Further, it should be noted that additional or other angle controlling actuators and/or angle controlling linkages (not shown) may be provided in order to control various angles of the extraction electrode system 205 with respect to the ion source chamber 202 in multiple planes, and are further contemplated as falling within the scope of the present disclosure.

Accordingly, the modular ion source and extraction apparatus 200 of FIGS. 1-4 may be removed from the ion implantation system 100, wherein another modular ion source and extraction apparatus is on standby and ready to be replaced in the ion implantation system. Conventional systems provide no such modularity, wherein an alignment process is conventionally needed after reassembling the ion source or extraction electrode in the ion implantation system 100 each time the ion source or extraction electrode is maintained. The present disclosure provides modularity, wherein the modular ion source and extraction apparatus 200 may be taken to a workbench and swapped with another modular ion source and extraction apparatus that has already been maintained and aligned, etc.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A modular ion source and extraction apparatus, comprising:
    an ion source chamber selectively electrically coupled to a voltage potential, wherein the ion source chamber comprises an extraction aperture;
    an extraction electrode system positioned proximate to the extraction aperture of the ion source chamber, wherein the extraction electrode system is configured to extract ions from the ion source chamber via one or more extraction electrodes;
    one or more linkages operably coupled to the ion source chamber;
    one or more insulators coupling the extraction electrode system to the respective one or more linkages, wherein the one or more insulators electrically insulate the respective one or more linkages from the extraction electrode system, therein electrically insulating the extraction electrode system from the ion source chamber; and
    one or more actuators operably coupling the one or more linkages to the ion source chamber, wherein the one or more actuators are configured to translate the one or more linkages with respect to the ion source chamber, therein translating the extraction electrode along one or more axes.

2. The modular ion source and extraction apparatus of claim 1, wherein the ion source chamber and extraction electrode are mechanically coupled via the one or more linkages and plurality of insulators, wherein the one or more actuators are electrically coupled to the ion source chamber.

3. The modular ion source and extraction apparatus of claim 1, wherein the one or more linkages comprise at least one gap controlling linkage and at least one angle controlling linkage, and wherein the one or more actuators comprise a gap controlling actuator and an angle controlling actuator, wherein the gap controlling actuator is operably coupled to the ion source chamber and configured to linearly translate the at least one gap controlling linkage along a first axis with respect to the ion source chamber, and wherein the angle controlling actuator is operably coupled to the ion source chamber and configured to linearly translate the at least one angle controlling linkage along a second axis with respect to the ion source chamber, wherein the first axis and second axis are approximately parallel and spaced a predetermined distance apart.

4. The modular ion source and extraction apparatus of claim 3, further comprising:
    a linear translation stage comprising:
        a base fixedly coupled to the ion source chamber; and
        a platform in linear sliding engagement with the base, wherein the at least one gap controlling linkage is generally fixedly coupled to the platform; and
    a frame operably coupled to the platform, wherein the gap controlling actuator is configured to linearly translate the platform and frame generally parallel to the first axis, therein linearly translating the at least one gap controlling linkage along the first axis.

5. The modular ion source and extraction apparatus of claim 4, wherein the angle controlling actuator is fixedly coupled to the platform, wherein the gap controlling actuator is further configured to linearly translate the angle controlling actuator generally parallel to the first axis, therein further linearly translating the at least one angle controlling linkage along the second axis.

6. The modular ion source and extraction apparatus of claim 4, wherein the ion source chamber comprises a flange that is distally opposed to the extraction aperture, wherein the flange comprises an interior side facing the extraction aperture and an exterior side opposing the interior side, and wherein the linear translation stage and frame are operably coupled to the exterior side of the flange.

7. The modular ion source and extraction apparatus of claim 6, wherein the base is fixedly coupled to the exterior side of the flange.

8. The modular ion source and extraction apparatus of claim 6, wherein the flange comprises one or more passages extending through the flange from the interior side to the exterior side thereof, wherein the at least one gap controlling linkage and at least one angle controlling linkage pass through the one or more passages of the flange.

9. The modular ion source and extraction apparatus of claim 8, further comprising a bellows respectively coupling the flange to each of the at least one gap controlling linkage and at least one angle controlling linkage, wherein each bellows provides a seal between the interior side of the flange and an environment associated with the exterior side of the flange.

10. The modular ion source and extraction apparatus of claim 8, wherein the at least one gap controlling linkage and at least one angle controlling linkage are in sliding engagement with the one or more passages.

11. The modular ion source and extraction apparatus of claim 4, comprising a plurality of linear translation stages having a plurality of bases and a plurality of platforms, wherein the frame is fixedly coupled to each of the plurality of platforms.

12. The modular ion source and extraction apparatus of claim 4, wherein the frame is rotatably coupled to the platform along a tilt axis, wherein the at least one gap controlling linkage is fixedly coupled to the frame along the tilt axis, and wherein the tilt axis is generally perpendicular to the first axis.

13. The modular ion source and extraction apparatus of claim 4, wherein the frame comprises a yoke having distal ends associated therewith, wherein the at least one gap controlling linkage comprises a first gap controlling linkage and a second gap controlling linkage fixedly coupled to respective distal ends of the yoke along the tilt axis.

14. The modular ion source and extraction apparatus of claim 13, wherein the linear translation stage comprises a plurality of bases fixedly coupled to the ion source chamber and a plurality of platforms in respective linear sliding engagement with the plurality of bases, wherein the plurality of platforms are fixedly coupled to the yoke.

15. The modular ion source and extraction apparatus of claim 14, wherein at least two of the plurality of platforms are fixedly coupled to the yoke proximate to the respective distal ends of the yoke.

16. The modular ion source and extraction apparatus of claim 3, further comprising a controller configured to selectively independently actuate the gap controlling actuator and angle controlling actuator, therein independently controlling the translation of the extraction electrode in the one or more axes.

17. The modular ion source and extraction apparatus of claim 3, wherein the gap controlling actuator and angle controlling actuator are operably coupled to a sidewall of the ion source chamber.

18. The modular ion source and extraction apparatus of claim 1, further comprising a controller configured to selectively independently actuate the one or more actuators, therein controlling the translation of the extraction electrode in the one or more axes.

19. The modular ion source and extraction apparatus of claim 1, wherein a position of the extraction electrode with respect to the ion source chamber is selectively fixed by the one or more actuators and one or more linkages.

20. The modular ion source and extraction apparatus of claim 19, further comprising a mounting apparatus configured to selectively couple the ion source chamber and extraction electrode as a module to an ion implantation system.

* * * * *